(12) United States Patent
Liu

(10) Patent No.: US 12,322,589 B2
(45) Date of Patent: Jun. 3, 2025

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Xiang Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 388 days.

(21) Appl. No.: 17/845,092

(22) Filed: Jun. 21, 2022

(65) Prior Publication Data

US 2023/0118405 A1 Apr. 20, 2023

Related U.S. Application Data

(63) Continuation of application No. PCT/CN2021/137478, filed on Dec. 13, 2021.

(30) Foreign Application Priority Data

Oct. 18, 2021 (CN) .......................... 202111208520.8

(51) Int. Cl.
*H01L 21/02* (2006.01)
*H01L 21/306* (2006.01)
*H01L 21/76* (2006.01)
*H01L 21/768* (2006.01)

(52) U.S. Cl.
CPC .. *H01L 21/02161* (2013.01); *H01L 21/30604* (2013.01); *H01L 21/7602* (2013.01); *H01L 21/7688* (2013.01)

(58) Field of Classification Search
None
See application file for complete search history.

(56) References Cited

U.S. PATENT DOCUMENTS

| | | | |
|---|---|---|---|
| 2009/0101968 A1* | 4/2009 | Sugioka | H01L 29/41791 257/E47.001 |
| 2012/0139021 A1 | 6/2012 | Kim | |
| 2015/0132943 A1* | 5/2015 | Kim | H10B 12/488 438/618 |
| 2015/0294923 A1* | 10/2015 | Shin | H01L 23/481 257/532 |
| 2020/0203353 A1 | 6/2020 | Liu | |
| 2021/0257373 A1* | 8/2021 | Kang | H10B 12/0335 |
| 2022/0085158 A1* | 3/2022 | Park | H01L 29/0653 |

FOREIGN PATENT DOCUMENTS

| | | |
|---|---|---|
| CN | 209056477 U | 7/2019 |
| CN | 110875317 A | 3/2020 |
| CN | 210296374 U | 4/2020 |
| CN | 111640750 A | 9/2020 |
| KR | 20120060660 A | 6/2012 |

\* cited by examiner

*Primary Examiner* — Erik Kielin
(74) *Attorney, Agent, or Firm* — Syncoda LLC; Feng Ma

(57) ABSTRACT

Embodiments of the disclosure provide a semiconductor structure and a method for forming the same. The semiconductor structure includes: a semiconductor substrate including a plurality of active areas and first isolation structures arranged at intervals along a first direction; gate structures located in the active areas and the first isolation structures. Top surfaces of the active areas extend beyond top surfaces of the gate structures; second isolation structures with a preset height located on surfaces of the gate structures, and the top surfaces of the second isolation structures are flush with the top surfaces of the active areas.

3 Claims, 35 Drawing Sheets

SEMICONDUCTOR STRUCTURE AND METHOD FOR FORMING SAME

CROSS-REFERENCE TO RELATED APPLICATIONS

The present application is a U.S. continuation application of International Application No. PCT/CN2021/137478, filed on Dec. 13, 2021, which claims priority to Chinese Patent Application No. 202111208520.8, filed on Oct. 18, 2021. International Application No. PCT/CN2021/137478 and Chinese Patent Application No. 202111208520.8 are incorporated herein by reference in their entireties.

BACKGROUND

With the continuous development of semiconductor technology, the requirements for the process accuracy of semiconductor devices become increasingly strict. In the preparation process of Dynamic Random Access Memory (DRAM), a contact window (overlapping area) between a storage node contact (SNC) and an active area is increasingly small. Moreover, a fence of a storage node contact in dynamic random access memory adopts the self-aligned quadruple patterning (SAQP) technology. Small deviation will lead to the decrease of a contact area between a storage node contact and an active area, and increase a contact resistance between the storage node contact and the active area, so that the reading and writing speed of a large number of memory units cannot meet the requirements. In addition, in related arts, adjacent SNCs are prone to contact with each other and form short circuit.

SUMMARY

In a first aspect, the embodiments of the disclosure provide a semiconductor structure. The semiconductor structure includes a semiconductor substrate, gates structures and second isolation structures.

The semiconductor substrate includes a plurality of active areas and first isolation structures arranged at intervals along a first direction.

The gate structures are located in the active areas and the first isolation structures, in which top surfaces of the active areas extend beyond top surfaces of the gate structures.

The second isolation structures have a preset height, in which each second isolation structure is located on a surface of a gate structure, and top surfaces of the second isolation structures are flush with the top surfaces of the active areas.

In a second aspect, the embodiments of the disclosure provide a method for forming a semiconductor structure, the method includes following operations.

A semiconductor substrate is provided, in which the semiconductor substrate provided includes a plurality of formed active areas and first initial isolation structures arranged at intervals along a first direction.

An initial gate structure is formed in each first initial isolation structure.

The initial first isolation structure and the initial gate structure are etched to form a first isolation structure, a gate structure and a second isolation structure having a preset height.

BRIEF DESCRIPTION OF THE DRAWINGS

In the drawings (which are not necessarily drawn to scale), similar reference numerals may describe similar components in different views. Similar reference numerals with different letter suffixes may denote different examples of similar components. The drawings generally illustrate the various embodiments discussed herein by way of examples and not limitation.

DETAILED DESCRIPTION

Figure 1:
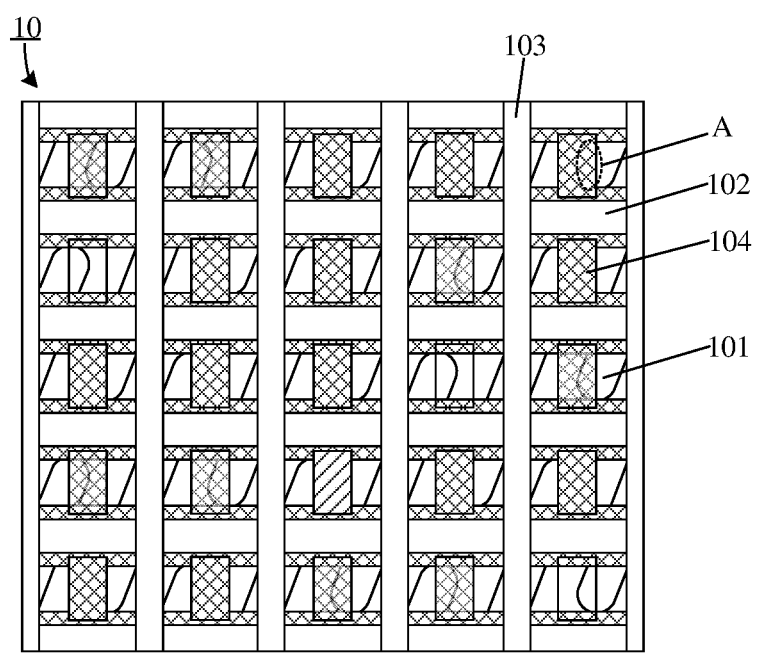
FIG. 1 is the structural scheme diagram of a semiconductor structure in related arts.

The disclosure relates to the technical field of semiconductors, and relates to but is not limited to a semiconductor structure and a method for forming the same.

Exemplary embodiments of the disclosure will be described in more detail below with reference to the accompanying drawings. Although exemplary embodiments of the disclosure are shown in the drawings, it should be understood that the disclosure may be embodied in various forms and should not be limited by the specific embodiments set forth herein. On the contrary, these embodiments are provided to enable a more thorough understanding of the disclosure and to fully convey the scope of the disclosure to those skilled in the art.

In the following description numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure; that is, all features of the actual embodiments are not described herein and well-known functions and structures are not described in detail.

In the drawings, the dimensions of layers regions elements and their relative dimensions may be exaggerated for clarity. Throughout, the same reference numerals denote the same elements.

It should be understood that when an element or layer is referred to as "on", "adjacent to", "connected to" or "coupled to" another element or layer, it may be directly on, adjacent to, connected to, or coupled to the other element or layer, or may exist intervening elements or layers. Conversely, when an element is called "directly on", "directly adjacent to", "directly connected to" or "directly coupled to" another element or layer, there is no intervening element or layer. It should be understood that while the terms first, second, third, etc. may be used to describe various elements, components, regions, layers, and/or portions, such elements, components, regions, layers, and/or portions should not be limited by such terms. These terms are used only to distinguish one element, component, region, layer, or part from another element, component, region, layer, or part. Thus, the first element, component, region, layer, or portion discussed below may be represented as a second element, component, region, layer, or portion without departing from the teachings of the disclosure. The discussion of a second element, component, region, layer or portion does not imply that a first element, component, region, layer or portion is necessarily present in the disclosure.

The terms used herein are intended to describe specific embodiments only and are not to be limitations of the disclosure. As used herein, the singular forms of "a", "an" and "said/the" are also intended to include the plural forms, unless the context clearly indicates otherwise. It should also be understood that the terms "composing" and/or "including", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

FIG. 1 is a structural scheme diagram of a semiconductor structure of the related art. The semiconductor structure of the related art will be explained with reference to FIG. 1, before detailing the semiconductor structure provided by the embodiments of the disclosure and the method for forming the same.

As shown in FIG. 1, a semiconductor structure 10 of the related art includes multiple active areas 101, multiple word lines 102 (which may act as buried gate structures), multiple bit lines 103, and a storage node contact 104 in contact with corresponding active area. It can be seen that a contact window A between a storage node contact 104 and an active area 101 in the related art is small, which increases the contact resistance between the storage node contact 104 and the active area 101, and then reduce the reading and writing speed of the memory unit. In addition, in related arts, adjacent storage nodes are prone to contact with each other, resulting in short circuit.

Based on the problems existing in related arts, the embodiments of the disclosure provide a semiconductor structure and a method for forming the same. The semiconductor structure includes: a semiconductor substrate, the semiconductor substrate including multiple active area and first isolation structures arranged at intervals along a first direction; gate structures located in the first isolation structures, and top surfaces of the active areas extend beyond top surfaces of the gate structures; second isolation structures having a preset height located on surfaces of the gate structures, and the top surfaces of the second isolation structures are flush with the top surfaces of the active areas. Since the semiconductor structure provided by the embodiments of the disclosure includes second isolation structures, each second isolation structure can be used to isolate adjacent SNCs, so that the formed SNCs are not short-circuited, and the electrical performance of the prepared semiconductor structure is improved. At the same time, the second isolation structure is formed by self-alignment in the preparation process, and the process complexity of preparing the semiconductor structure is reduced.

Figure 2A:
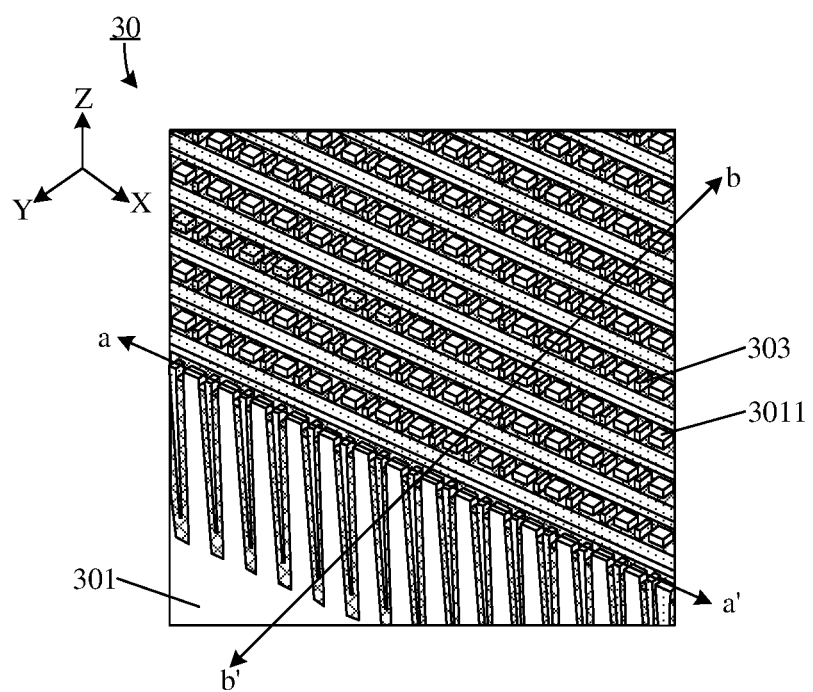
FIG. 2A is a three-dimensional structural scheme diagram of the semiconductor structure provided by the embodiments of the disclosure.
Figure 2B:
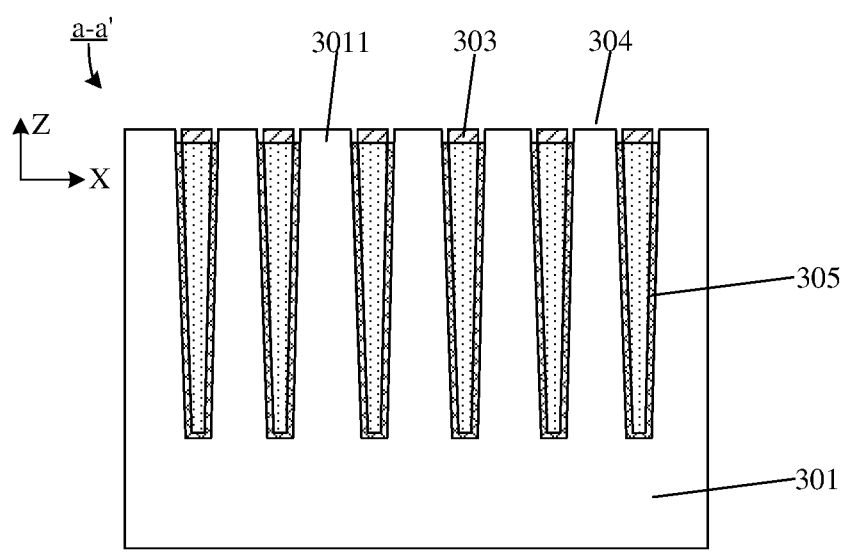
FIG. 2B is a cross-sectional view of the semiconductor structure provided by the embodiments of the disclosure along the word line direction.
Figure 2C:
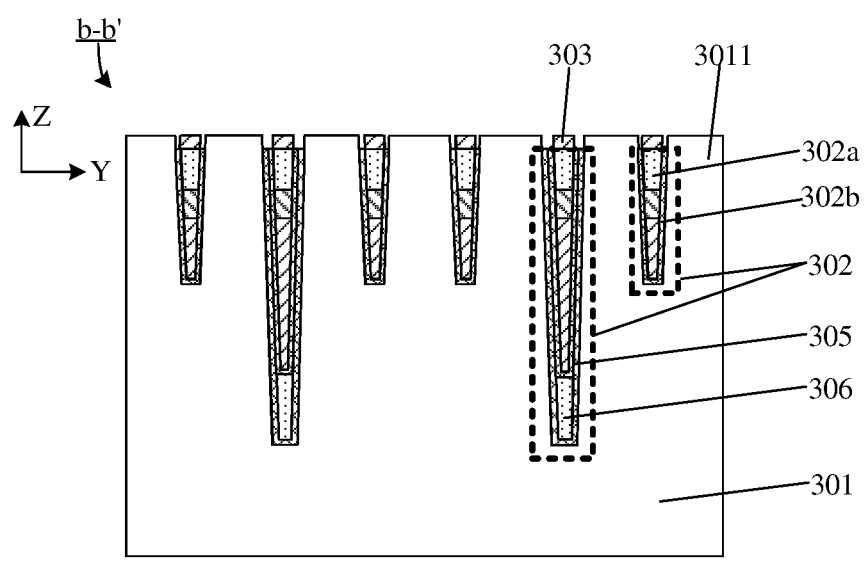
FIG. 2C is a cross-sectional view of the semiconductor structure provided by the embodiments of the disclosure along the extension direction of an active area.

The embodiments of the disclosure provide a semiconductor structure. FIG. 2A is a three-dimensional structural scheme diagram of the semiconductor structure provided by the embodiments of the disclosure. FIG. 2B is a cross-sectional view of the semiconductor structure along a word line extension direction (a-a' direction). FIG. 2C is a cross-sectional view of the semiconductor structure along an active area extension direction (b-b' direction). As shown in FIGS. 2A to 2C, the semiconductor structure 30 includes a semiconductor substrate 301, gate structures 302, and second isolation structures 303 having a preset height.

In the embodiments of the disclosure, the semiconductor substrate 301 may be a silicon substrate. The semiconductor substrate may also include other semiconductor elements such as germanium (Ge), or semiconductor compounds such as silicon carbide (SiC), gallium arsenide (GaAs), gallium phosphide (GaP), indium phosphide (InP), indium arsenide (InAs), or indium antimonide (InSb), or other semiconductor alloys such as silicon germanium (SiGe), arsenic gallium phosphide (GaAsP), indium aluminum arsenide (AlInAs), gallium aluminum arsenide (AlGaAs), indium gallium arsenide (GaInP), and/or indium gallium arsenide phosphide (GaInAsP) or combinations thereof.

The semiconductor substrate may include a top surface at a front surface and a bottom surface at a back surface opposite to the front surface. A direction perpendicular to the top surface and the bottom surface of the semiconductor substrate is defined as a second direction without considering the flatness of the top surface and the bottom surface. A first direction and a third direction intersecting with each other are defined in on the top surface and the bottom surface of the semiconductor substrate (that is, the plane where the semiconductor substrate is located). For example, a word line extension direction may be defined as the first direction, and an active area extension direction may be defined as the third direction. Herein there is an included angel between the first direction and the third direction, and the included angle is not 90 degrees. The plane of the semiconductor substrate can be determined based on the first direction and the third direction. In the embodiments of the disclosure, as shown in FIGS. 2A to 2C, the first direction is defined as an X-axis direction, the second direction is defined as a Z-axis direction, and the third direction is defined as a Y-axis direction.

The semiconductor substrate 301 includes multiple active areas 3011 and first isolation structures arranged at intervals along the X-axis direction. The gate structures 302 are located in the first isolation structures and the active areas 3011. A top surface of the active area 3011 extends beyond a top surface of the gate structure 302. The second isolation structure 303 having a preset height is located on a surface of corresponding gate structure 302. The top surface of the second isolation structure 303 is flush with the top surface of an active area 3011.

In the embodiments of the disclosure, the preset height may be 5 nanometer (nm) to 20 nm.

In some embodiments, each gate structure 302 includes at least a gate insulating layer 302a and a gate dielectric layer 302b disposed on sidewalls of the gate insulating layer 302a. A top surface of the gate insulating layer 302a is the top surface of the gate structure 302.

In other embodiments, each gate structure 302 also includes a gate metal layer below the gate insulating layer, which may be composed of one metal layer or two metal layers, without additional limitations herein.

In some embodiments, each first isolation structure includes an isolation trench, a first etched isolation layer 305, and a second etched isolation layer 306. The first etched isolation layer 305 is located on the inner wall of the isolation trench, and a top surface of the first etched isolation layer 305 is flush with the top surface of the gate structure 302. The second etched isolation layer 306 is located between the bottom of the gate structure 302 and the isolation trench.

Figure 2D:
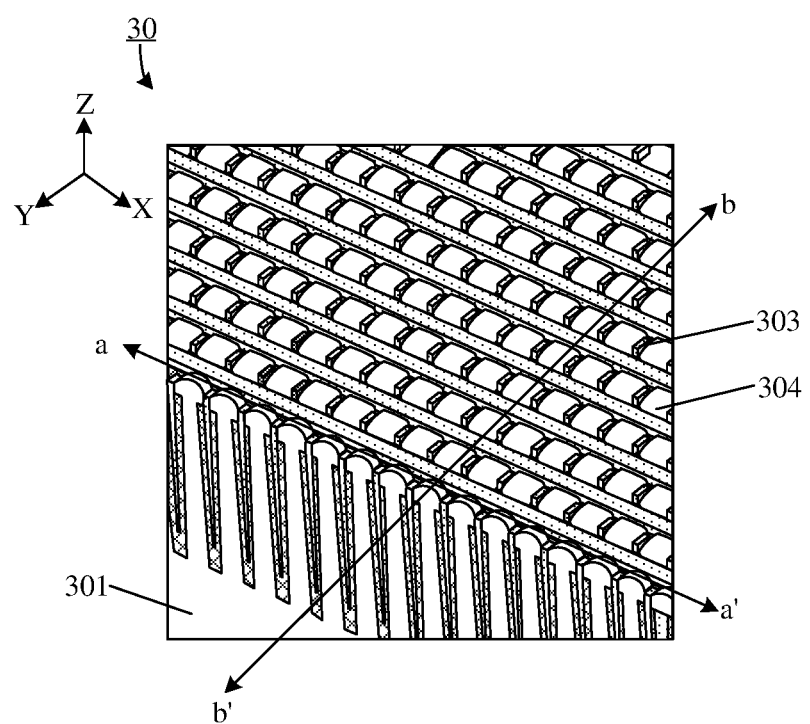
FIG. 2D is another three-dimensional structure scheme diagram of the semiconductor structure provided by embodiments of the disclosure.
Figure 2E:
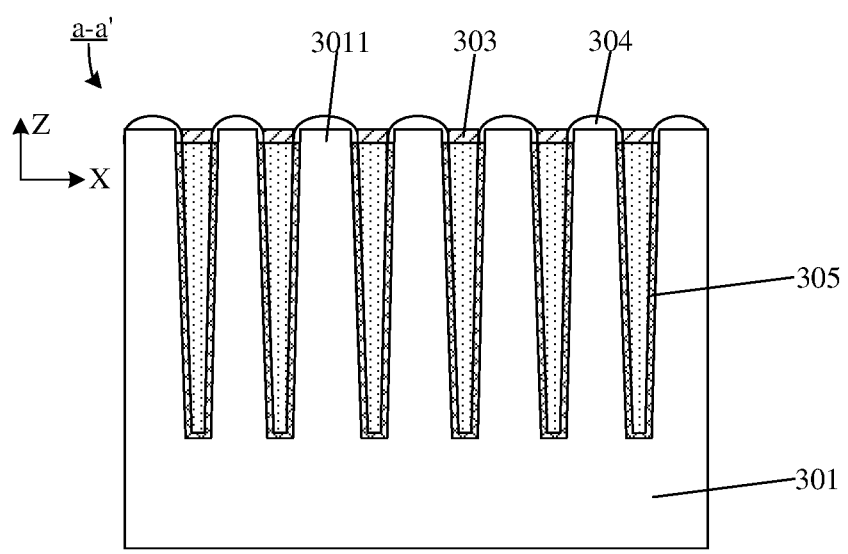
FIG. 2E is a cross-sectional view of the semiconductor structure provided by the embodiments of the disclosure along a word line direction.
Figure 2F:
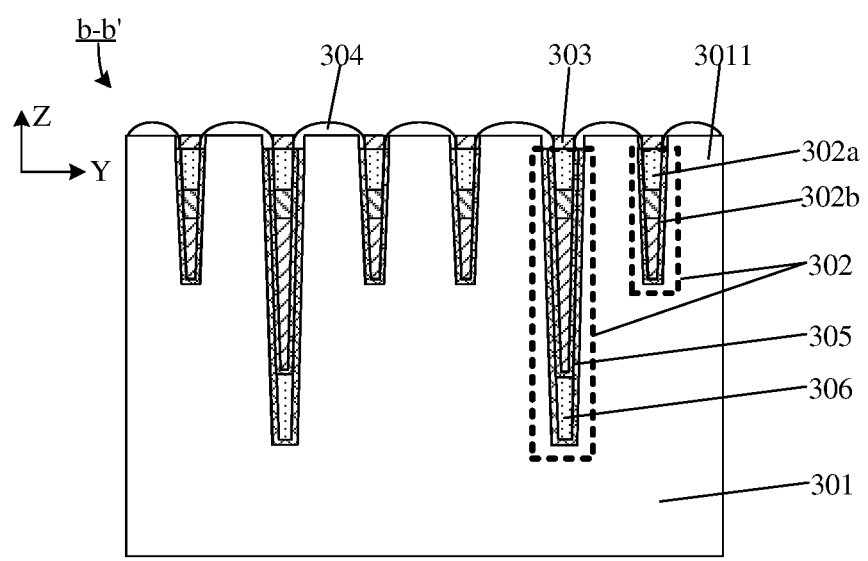
FIG. 2F is a cross-sectional view of the semiconductor structure provided by the embodiments of the disclosure along the extension direction of an active area.

FIG. 2D is another three-dimensional structural view of the semiconductor structure provided by the embodiments of the disclosure. FIG. 2E is a cross-sectional view of a semiconductor structure in a word line extension direction (a-a' direction). FIG. 2F is a cross-sectional view of a semiconductor structure in an active area extension direction (b-b' direction). As shown in FIGS. 2D to 2F. The semiconductor structure 30 includes a semiconductor substrate 301, gate structures 302, second isolation structures 303 having a preset height, and epitaxial structures 304.

An epitaxial structure 304 is located between any two adjacent ones of the second isolation structures 303 in the X-axis direction; sidewalls of the epitaxial structure 304 are in contact with the second isolation structure 303, and a top surface of the epitaxial structure 304 extends beyond the top surface of the second isolation structure 303.

As can be seen with reference to FIGS. 2A and 2D, the top surfaces of the second isolation structures 303 are flush with the top surfaces of the active areas 3011 prior to the formation of the epitaxial structures 304.

In some embodiments, the semiconductor structure also includes a bit line structure (not shown); The bit line structure is located on the surface of the active area between two adjacent ones of the gate structures in the active area; The extending direction of the bit line structure is perpendicular to the extending direction of the gate structure, and the bit line structure at least includes a bit line contact layer, a bit line metal layer and a bit line insulating layer stacked from the bottom to the top in sequence along the Z axis direction.

In some embodiments, the semiconductor structure also includes storage node contacts (not shown). The storage node contacts are located on the sidewalls of the bit line structures, and each storage node contact is in contact with a top surface of the epitaxial structure.

In the embodiments of the disclosure, the epitaxial structure can increase a contact area between the active area and the storage node contact, which is beneficial to the alignment between the active area and the storage node contact.

Give that the semiconductor structure provided by the embodiments of the disclosure has the second isolation structures which can be used to isolate the adjacent storage node contacts, a short circuit between the formed storage node contacts are not caused, thereby improving the electrical properties of the semiconductor structure.

Figure 3:
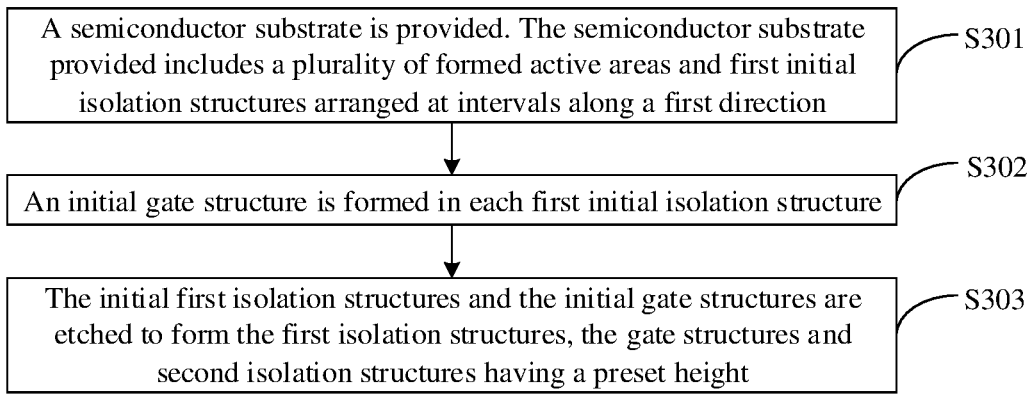
FIG. 3 is a flow scheme diagram of the method for forming a semiconductor structure provided by the embodiments of the disclosure.

The embodiments of the disclosure also provide a method for forming a semiconductor structure. FIG. 3 is a flow scheme diagram of the method for forming a semiconductor structure provided by the embodiments of the disclosure. As shown in FIG. 3, the method for forming a semiconductor structure includes the following operations.

S301, a semiconductor substrate is provided, in which the semiconductor substrate provided includes multiple formed active areas and first initial isolation structures arranged at intervals along a first direction.

Each first initial isolation structure is used to isolate the adjacent active areas.

S302, an initial gate structure is formed in each first initial isolation structure.

S303, the first initial isolation structures and the initial gate structures are etched to form first isolation structures, gate structures and second isolation structures having a preset height.

FIGS. 4A to 4J and 5A to 5Q are structural scheme diagrams showing a formation process of the semiconductor structure provided by embodiment of this disclosure. Next, referring to the FIGS. 4A to 4J and 5A to 5Q, the method for forming a semiconductor structure provided by the embodiments of the disclosure is further described in detail.

First, S301 is executed. A semiconductor substrate is provided. The provided semiconductor substrate includes multiple formed active areas and first initial isolation structures arranged at intervals along a first direction.

In some embodiments, the first initial isolation structures may be formed by the following operations.

The semiconductor substrate is etched to form multiple isolation trenches arranged at intervals along the first direction.

Figure 4A:
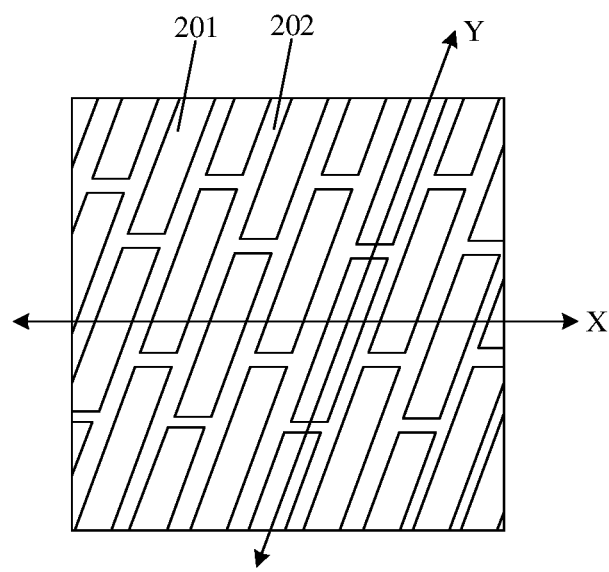
FIG. 4A is a structural scheme diagram showing a forming process of a semiconductor structure provided by the embodiments of the disclosure.
Figure 4B:
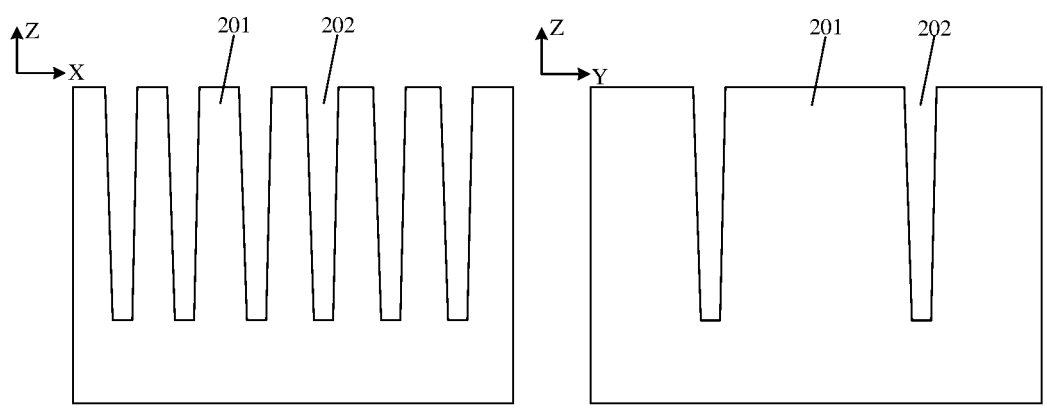
FIG. 4B is a structural scheme diagram showing a forming process of a semiconductor structure provided by the embodiments of the disclosure.

FIG. 4A is a top view of a semiconductor substrate provided by the embodiments of the disclosure. FIG. 4B is a sectional view of the semiconductor substrate along the X-axis direction and the Y-axis direction. As shown in FIGS. 4A and 4B, the semiconductor substrate is etched to form multiple active areas 201 and isolation trenches 202 arranged at intervals in the X-axis direction.

A first isolation layer and a second isolation layer are formed sequentially on the inner wall of each isolation trench to form the first initial isolation structure. The second isolation layer fills the isolation trench.

In some embodiments, the first isolation layer is also attached to a surface of the active area, and the first isolation layer may be formed in three ways.

The first way: a first isolation material is deposited on the inner wall of the isolation trenches and the surfaces of the active areas to form the first isolation layer.

The first isolation material may be any insulating material such as silicon dioxide, silicon nitride or silicon oxynitride. In the embodiments of the disclosure, the first isolation material may be deposited to form the first isolation layer by any suitable deposition process, for example, a chemical vapor deposition (CVD) process, a physical vapor deposition (PVD) process, an atomic layer deposition (ALD) process, a spin coating process, or a coating process.

The second way: a sacrificial material is deposited on the inner wall of the isolation trenches and the surfaces of the active areas to form a sacrificial layer.

In the embodiments of the disclosure, the sacrificial material may be a monocrystalline silicon material or a polysilicon material.

Figure 4C:
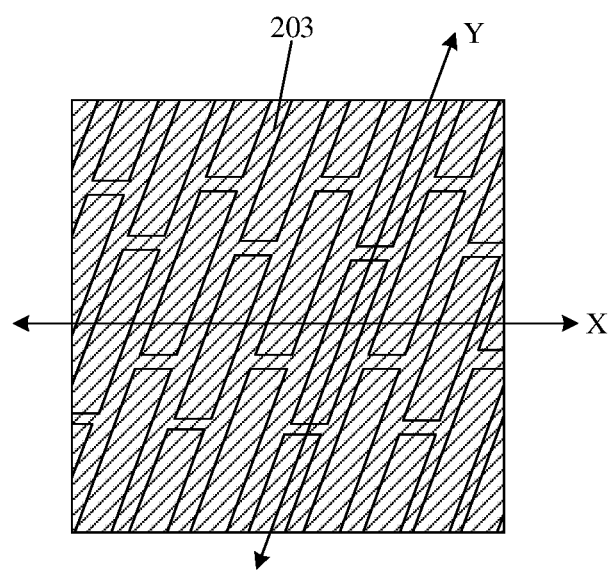
FIG. 4C is a structural scheme diagram showing a forming process of a semiconductor structure provided by the embodiments of the disclosure.
Figure 4D:
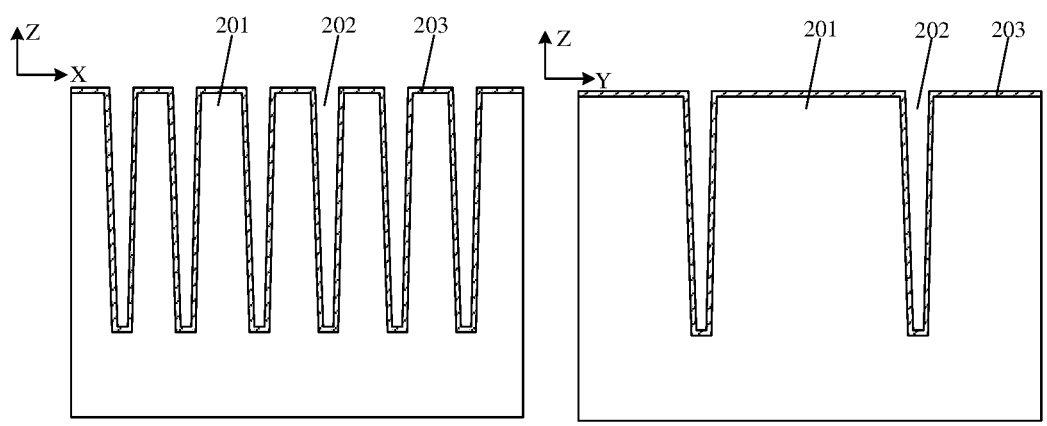
FIG. 4D is a structural scheme diagram showing a forming process of a semiconductor structure provided by the embodiments of the disclosure.

FIG. 4C is a top view of the deposited sacrificial material provided by the embodiments of the disclosure. FIG. 4D is a cross-sectional view along the X-axis direction and the Y-axis direction. As shown in FIGS. 4C and 4D, a sacrificial material is deposited on the surfaces of the isolation trenches 202 and the active areas 201 to form a sacrificial layer 203.

The sacrificial layer is oxidized in situ to form the first isolation layer.

Figure 4E:
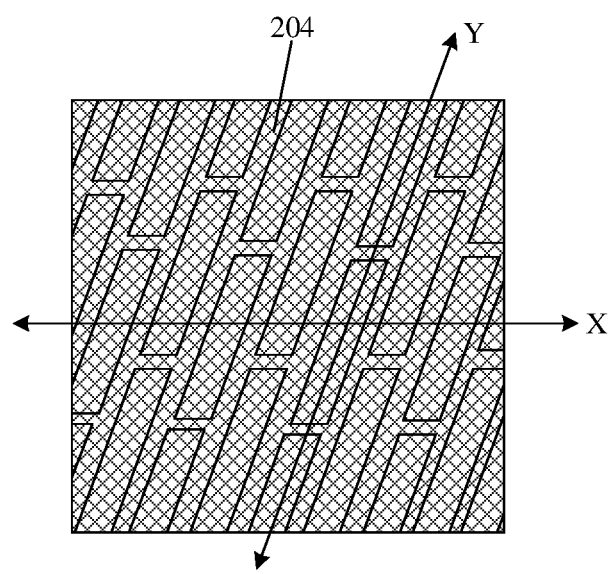
FIG. 4E is a structural scheme diagram showing a forming process of a semiconductor structure provided by the embodiments of the disclosure.
Figure 4F:
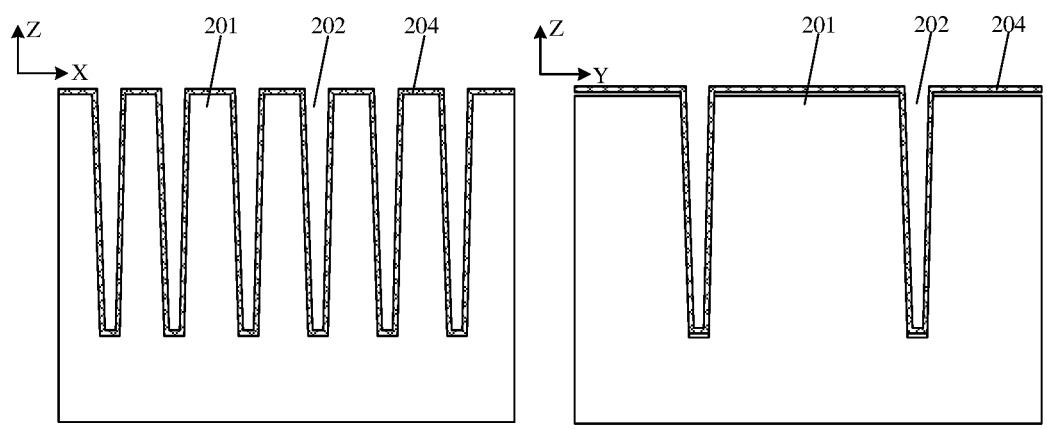
FIG. 4F is a structural scheme diagram showing a forming process of a semiconductor structure provided by the embodiments of the disclosure.

FIG. 4E is a top view of a formed first isolation layer provided by the embodiments of the disclosure. FIG. 4F is a cross-sectional view along the X-axis direction and the Y-axis direction. As shown in FIGS. 4E and 4F, the sacrificial layer 203 is oxidized in situ to form the first isolation layer 204.

The third way: the inner walls of the isolation trenches and the surfaces of the active areas are thermally oxidized to form the first isolation layer.

It should be noted that the third way of forming the first isolation layer, i.e., the thermal oxidation of the inner walls of the isolation trenches and the surfaces of active areas, may cause certain damages to the surfaces of the isolation trenches and the active areas, and make the size of the isolation trenches larger and the size of the active areas smaller.

In some embodiments, the second isolation layer may be formed by the following approach.

A second isolation material is deposited on the surfaces of the first isolation layer to form a second initial isolation layer.

In the embodiments of the disclosure, the second isolation material may be any insulating material such as silicon dioxide, silicon nitride, or silicon oxynitride.

Figure 4G:
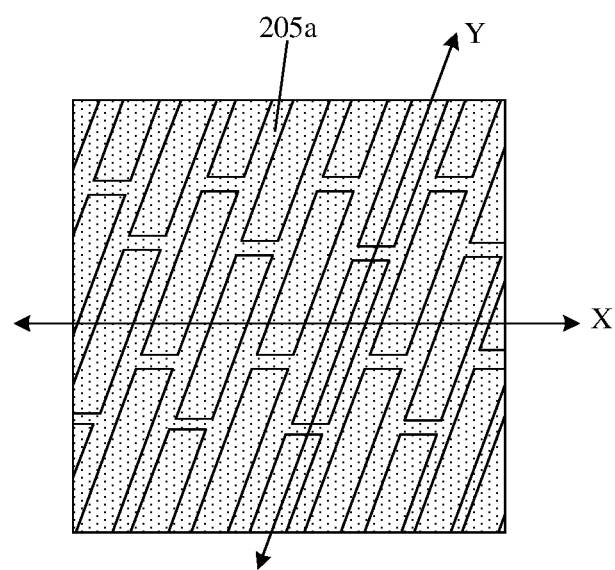
FIG. 4G is a structural scheme diagram showing a forming process of a semiconductor structure provided by the embodiments of the disclosure.
Figure 4H:
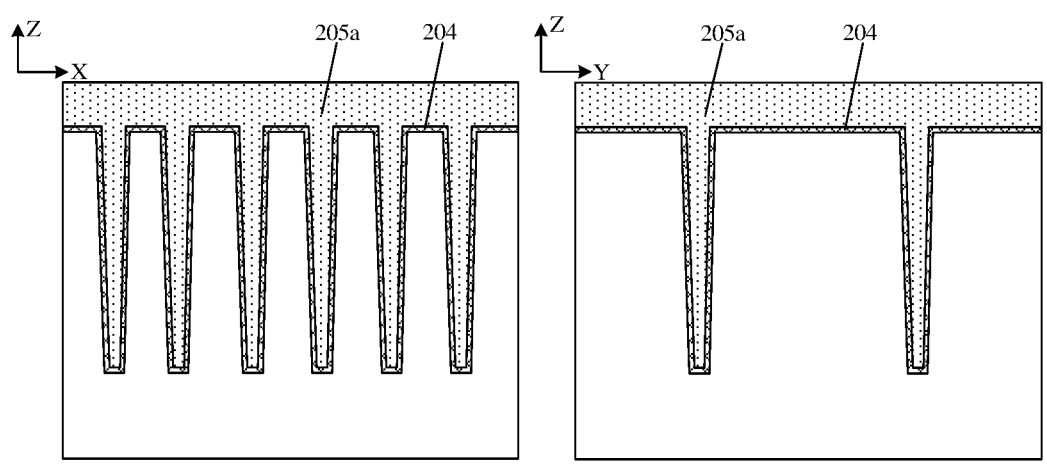
FIG. 4H is a structural scheme diagram showing a forming process of a semiconductor structure provided by the embodiments of the disclosure.

FIG. 4G is a top view of a formed second initial isolation layer provided by the embodiments of the disclosure. FIG. 4H is cross-sectional views along the X-axis direction and the Y-axis direction. As shown in FIGS. 4G and 4H, a second initial isolation layer 205a is formed by depositing the second isolation material on the surface of the first isolation layer 204 using any suitable deposition process.

The second initial isolation layer is processed to form the second isolation layer.

In some embodiments, the operation that the second initial isolation layer is processed to form the second isolation layer includes: the second initial isolation layer is planarized or etched until the first isolation layer on the surfaces of the active areas is exposed, to form the second isolation layer.

In the embodiments of the disclosure, the etching process for the second initial isolation layer may be performed by a dry etching process such as a plasma etching process, a reactive ion etching process, or an ion milling process, or by a wet etching process.

Figure 4I:
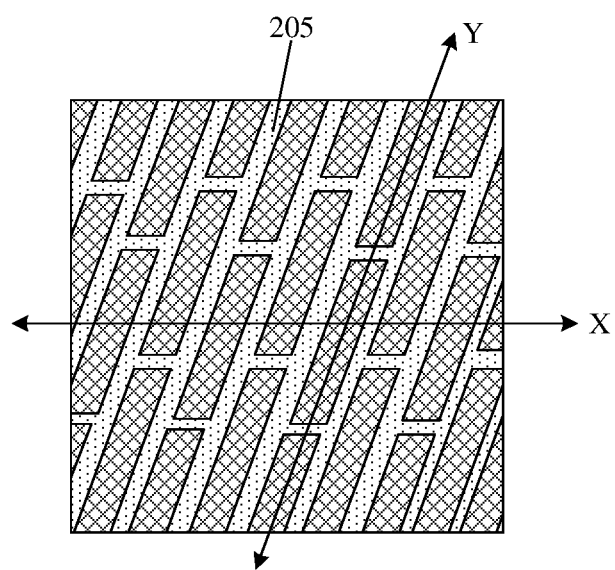
FIG. 4I is a structural scheme diagram showing a forming process of a semiconductor structure provided by the embodiments of the disclosure.
Figure 4J:
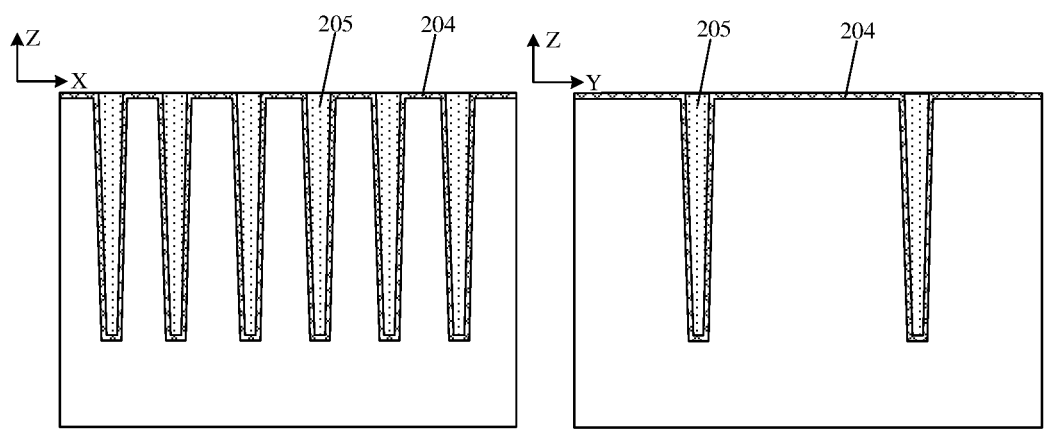
FIG. 4J is a structural scheme diagram showing a forming process of a semiconductor structure provided by the embodiments of the disclosure.

FIG. 4I is a top view of a formed second isolation layer provided by the embodiments of the disclosure. FIG. 4J is a cross-sectional view along the X-axis direction and the Y-axis direction. As shown in FIGS. 4I and 4J, the second initial isolation layer 205a is etched or chemical mechanical polished (CMP) until the first isolation layer 204 on the surfaces of the active area is exposed, to form the second isolation layer 205 located in the isolation trenches.

Next, S302 is executed. An initial gate structure is formed in each first initial isolation structure.

In some embodiments, the operation that the initial gate structure is formed in each first initial isolation structure includes the following operation.

Part of the second isolation layer is etched along the second direction to form a first gate trench and a second etched isolation layer.

The operation that part of the second isolation layer is etched to form the first gate trench means part of the second isolation layer is etched along the second direction, that is, after forming the first gate trench, part of the second isolation layer is retained at the bottom of the first gate trench, and the retained second isolation layer forms a second etched isolation layer.

Figure 5A:
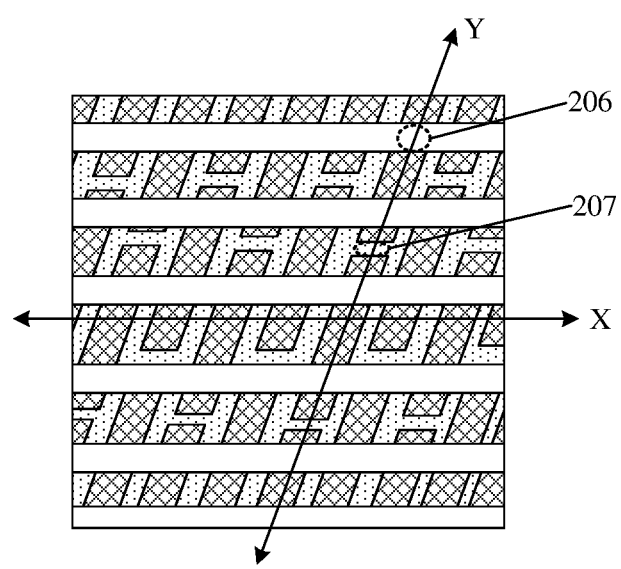
FIG. 5A is a structural scheme diagram showing a forming process of a semiconductor structure provided by the embodiments of the disclosure.
Figure 5B:
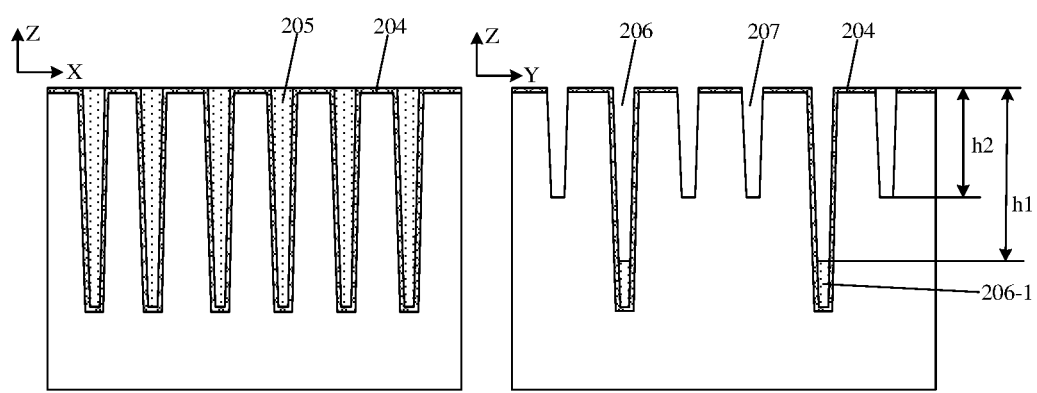
FIG. 5B is a structural scheme diagram showing a forming process of a semiconductor structure provided by the embodiments of the disclosure.

FIG. 5A is a top view of the formed first gate trench provided by the embodiments of the disclosure. FIG. 5B is cross-sectional views along the X-axis direction and the Y-axis direction. As shown in FIGS. 5A and 5B, in the Z-axis direction, part of second isolation layer 205 is etched to form the first gate trench 206 and a second etched isolation layer 206-1.

It should be noted that since the cross-sectional view along the X-axis direction (corresponding to the left panel in FIG. 5B) does not cut on a word line, the formed first gate trenches cannot be seen in the left panel in FIG. 5B.

A first gate dielectric layer is formed on the inner wall of each first gate trench.

Figure 5C:
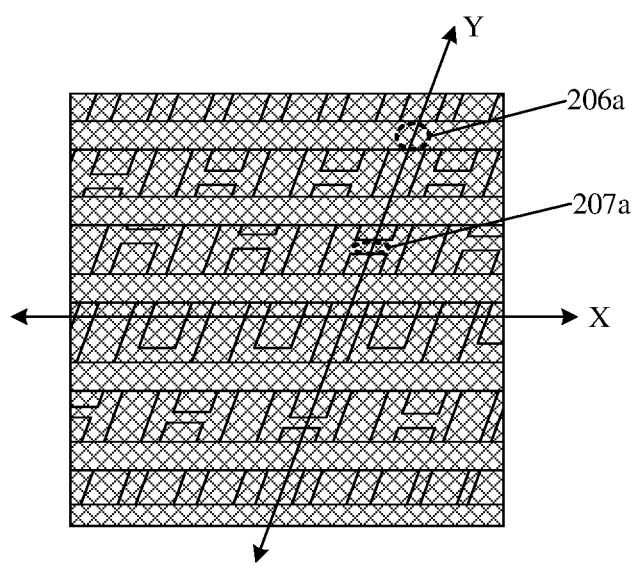
FIG. 5C is a structural scheme diagram showing a forming process of a semiconductor structure provided by the embodiments of the disclosure.
Figure 5D:
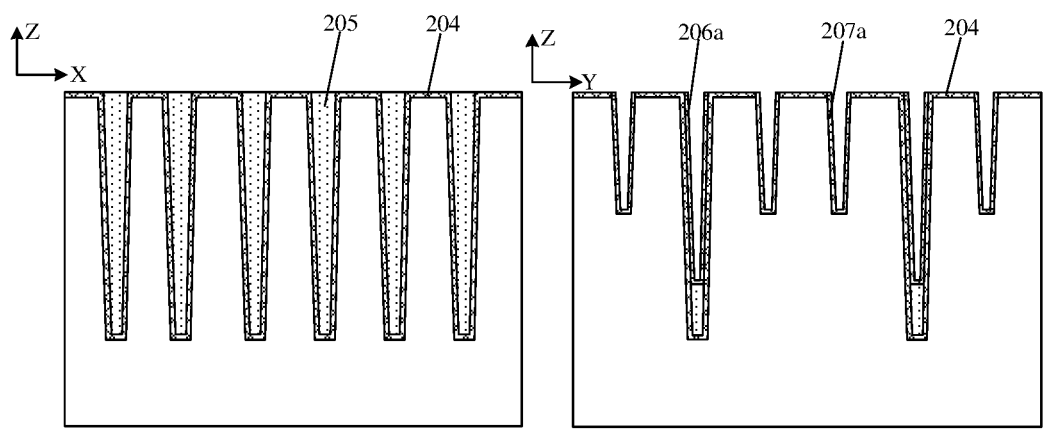
FIG. 5D is a structural scheme diagram showing a forming process of a semiconductor structure provided by the embodiments of the disclosure.

FIG. 5C is a top view of the formed first gate dielectric layer provided by the embodiments of the disclosure. FIG. 5D is cross-sectional views along the X-axis direction and the Y-axis direction. As shown in FIGS. 5C and 5D, the first gate dielectric layer 206a is formed on inner wall of each first gate trench 206. In the embodiments of the disclosure, the first gate dielectric layer 206a may be formed by any suitable deposition process, and the first gate dielectric layer may be an oxide layer such as a silicon oxide layer.

In the embodiments of the disclosure, materials made the first isolation layer and the first gate dielectric layer are the same, or the first isolation layer and the first gate dielectric layer have the same etching selection ratio, that is, the first isolation layer and the first gate dielectric layer can be removed simultaneously under the same etching condition.

A first gate metal layer is formed at the bottom of each first gate trench on which the first gate dielectric layer is formed.

In the embodiments of the disclosure, the first gate metal layer may be composed of one metal layer, two metal layers, or multiple metal layers. The metal layer material includes tungsten, cobalt, copper, aluminum, polysilicon, doped silicon, silicide, titanium nitride, or any combination thereof.

A first gate insulating layer is formed on the surface of the first gate metal layer.

Figure 5E:
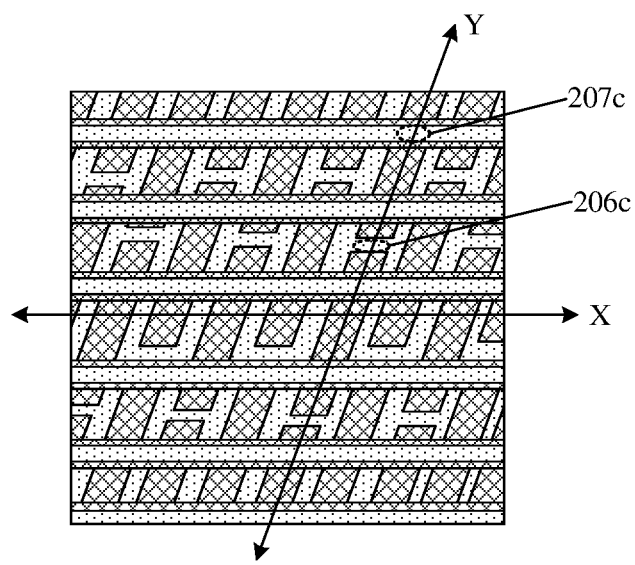
FIG. 5E is a structural scheme diagram showing a forming process of a semiconductor structure provided by the embodiments of the disclosure.
Figure 5F:
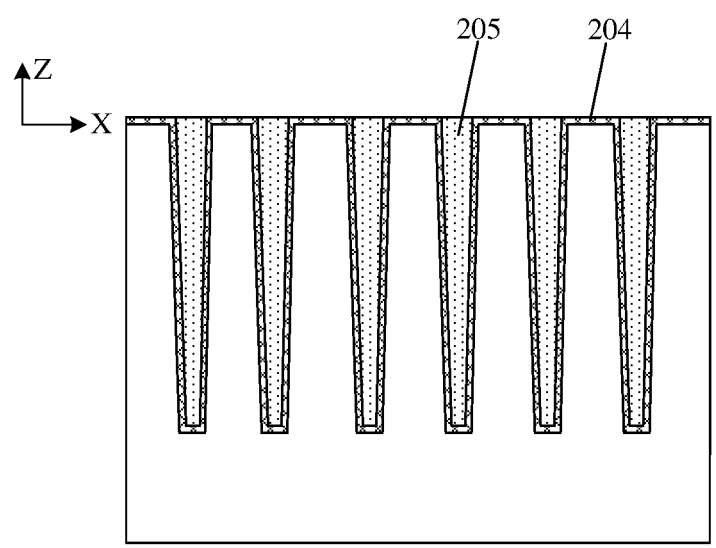
FIG. 5F is a structural scheme diagram showing a forming process of a semiconductor structure provided by the embodiments of the disclosure.
Figure 5G:
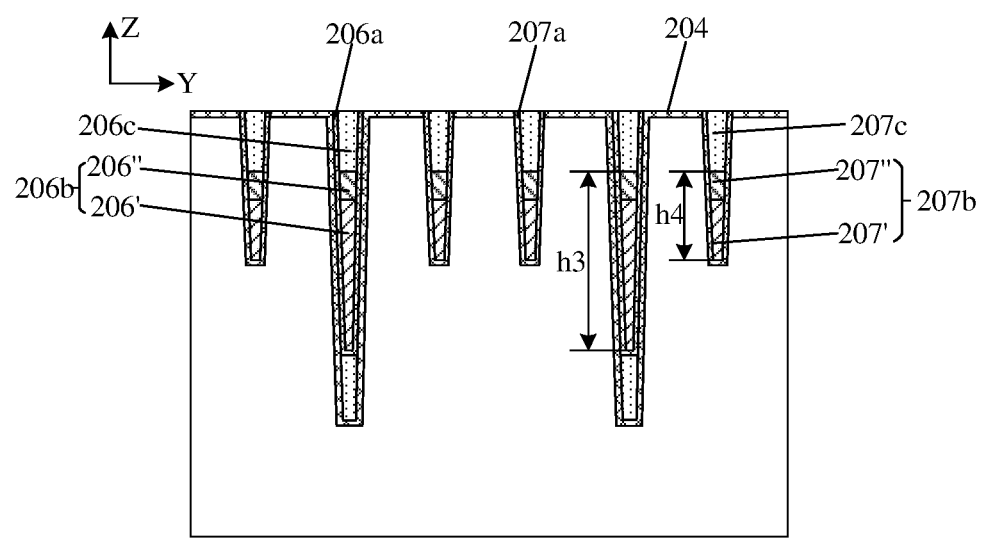
FIG. 5G is a structural scheme diagram showing a forming process of a semiconductor structure provided by the embodiments of the disclosure.

FIG. 5E is a top view of the formed first gate metal layer and first gate insulating layer provided by the embodiments of the disclosure. FIGS. 5F and 5G are sectional views along the X-axis direction and the Y-axis direction, respectively. As shown in FIGS. 5E to 5G, a metal material is filled in each first gate trench on which the first gate dielectric layer 206a is formed. The filled metal material is etched back to form a first gate metal layer 206b at the bottom of each first gate trench, a first gate insulating layer 206c is formed on the surface of the first gate metal layer 206b, and the top surface of the first gate insulating layer 206c is flush with the top surface of the first isolation layer 204. In the embodiments of the disclosure, the first gate metal layer 206b is composed of two metal layers, i.e., a metal layer 206' and a metal layer 206". In the embodiments of the disclosure, the metal layer 206" may be polysilicon or titanium nitride, and the metal layer 206' may be metal tungsten. The work function of the metal layer 206" is lower than that of the metal layer 206', so that the gate-induced drain leakage (GIDL) can be reduced.

In the embodiments of the disclosure, the materials of the first gate insulating layer and the first gate dielectric layer are different, and the first gate insulating layer has a greater etch selection ratio relative to the first gate dielectric layer. For example, the first gate insulating layer may be a silicon nitride layer and the first gate dielectric layer may be a silicon oxide layer.

In some embodiments, the initial gate structures are also formed in the active areas. The initial gate structures located in the active areas and the initial gate structures located in the first initial isolation structures are formed simultaneously with the same process operation.

In some embodiments, the initial gate structures located in the active areas are formed by the following operation.

The first isolation layer and the active areas are sequentially etched along the second direction to form second gate trenches.

Again, referring to FIGS. 5A and 5B, the first isolation layer 204 and the active areas are sequentially etched along the Z-axis direction to form the second gate trenches 207.

It should be noted that since the cross-sectional view along the X-axis direction (corresponding to the left panel in FIG. 5B) does not cut on a word line, the formed second gate trenches cannot be seen in the left panel in FIG. 5B.

In the embodiments of the disclosure, because the materials made the active areas and the second isolation layer are different, and the etching selection ratio of the second isolation layer is greater than that of the active areas, the depths of the first gate trenches and the second gate trenches that are formed in the process of simultaneously etching the second isolation layer and the active areas are different. As shown in FIG. 5A, the dimension h2 of the second gate trenches 207 in the Z-axis direction is smaller than the dimension h1 of the first gate trenches 206 in the Z-axis direction.

A second gate dielectric layer is formed on the inner wall of each second gate trench.

Again, referring to FIGS. 5C and 5D, the second gate dielectric layer 207a is formed on the inner wall of each second gate trench 207. In the embodiments of the disclosure, the second gate dielectric layer 207a may be formed by any suitable deposition process, and the second gate dielectric layer may be an oxide layer such as a silicon oxide layer.

In the embodiments of the disclosure, the materials made the first isolation layer and the second gate dielectric layer are the same, or the first isolation layer and the second gate dielectric layer have the same etching selection ratio, that is, the first isolation layer and the second gate dielectric layer can be simultaneously removed under the same etching conditions.

A second gate metal layer is formed in each second gate trench on which the second gate dielectric layer is formed.

In the embodiments of the disclosure, the second gate metal layer may also be composed of one metal layer, two metal layers, or multiple metal layers. The metal layer material includes tungsten, cobalt, copper, aluminum, polysilicon, doped silicon, silicide, titanium nitride, or any combination thereof.

A second gate insulating layer is formed on the surface of the second gate metal layer.

Again, referring to FIGS. 5E to 5G, a metal material is filled in each second gate trench on which a second gate dielectric layer 207a is formed. The filled metal material is etched back to form a second gate metal layer 207b at the bottom of the second gate trench, and a second gate insulating layer 207c is formed on the surface of the second gate metal layer 207b. The top surface of the second gate insulating layer 207c is flush with the top surface of the first isolation layer 204. In the embodiments of the disclosure, the second gate metal layer 207b is composed of two metal layers, i.e., a metal layer 207' and a metal layer 207'', and a dimension h4 of the second gate metal layer 207b in the Z-axis direction is smaller than a dimension h3 of the first gate metal layer 206b in the Z-axis direction.

In the embodiments of the disclosure, the metal layer 207" may be polysilicon or titanium nitride, and the metal layer 207' may be metal tungsten. The work function of the metal layer 207" is lower than that of the metal layer 207", so that the GIDL can be reduced.

It should be noted that since the initial gate structures located in the active areas and the initial gate structures located in the second isolation layer are formed simultaneously in the same process operation, the first gate dielectric layer and the second gate dielectric layer are made with the same material, the first gate metal layer and the second gate metal layer are made with the material, and the first gate insulating layer and the second gate insulating layer are made with the same material.

In some embodiments, after forming the initial gate structures, the method for forming the semiconductor structures further includes the following operation.

The first isolation layer on the surfaces of the active areas are planarized or etched until the surfaces of the active areas are exposed.

Figure 5H:
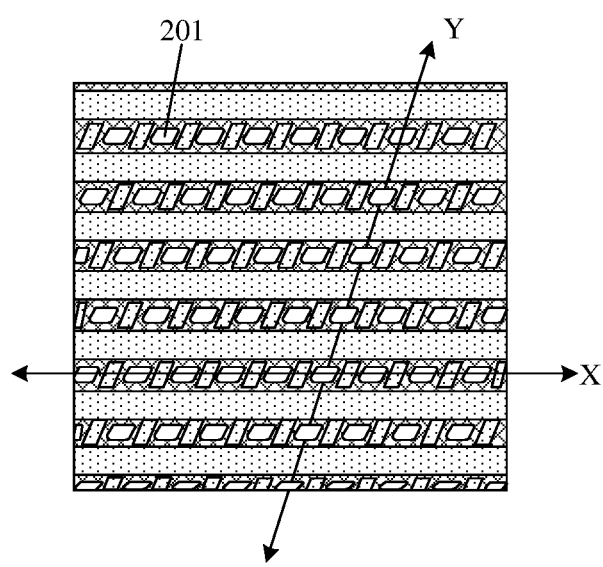
FIG. 5H is a structural scheme diagram showing a forming process of a semiconductor structure provided by the embodiments of the disclosure.
Figure 5I:
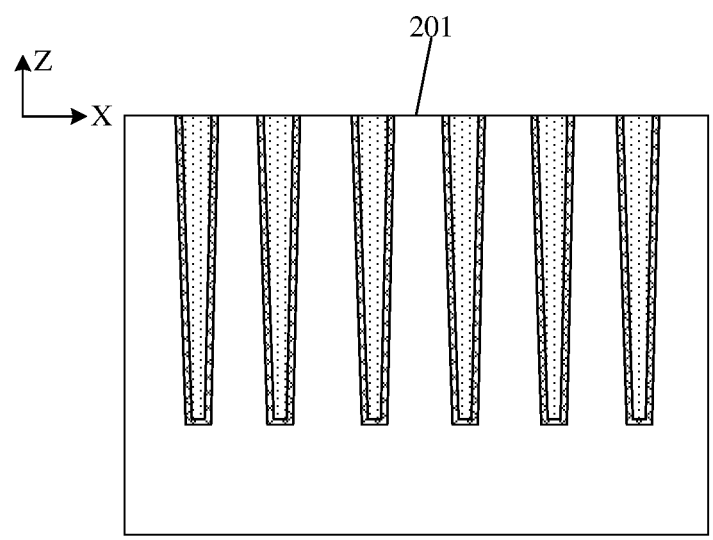
FIG. 5I is a structural scheme diagram showing a forming process of a semiconductor structure provided by the embodiments of the disclosure.
Figure 5J:
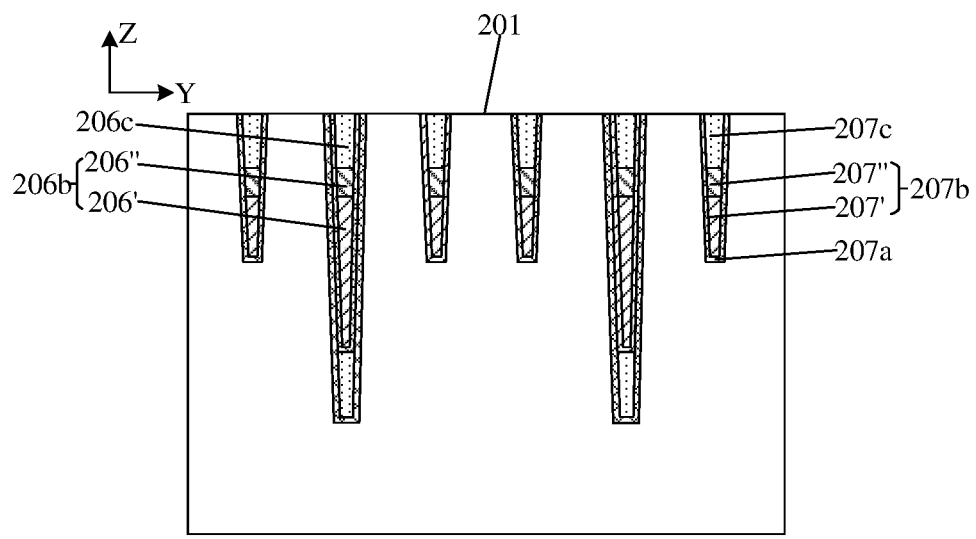
FIG. 5J is a structural scheme diagram showing a forming process of a semiconductor structure provided by the embodiments of the disclosure.

FIG. 5H is a top view provided by the embodiments of the disclosure where the first isolation layer on the surfaces of the active areas is removed. FIGS. 5I and 5J are sectional views in the X-axis direction and the Y-axis direction, respectively. As shown in FIGS. 5H to 5J, an etching process or a chemical mechanical polishing process may be performed in the embodiments of the disclosure to etch the first isolation layer 204 on the surfaces of the active areas until the surfaces of the active areas 201 are exposed.

It should be noted that in the embodiments of the disclosure, when the first isolation layer 204 on the surfaces of the active areas are removed, part of the initial gate structure in the active area and part of the initial gate structure in the first isolation structure are also removed, so that the top surface of the initial gate structure in the active area and the initial gate structure in the first isolation structure are both flush with the surface of the active area.

Next, S303 is executed. The initial first isolation structures and the initial gate structures are etched to form first isolation structures, gate structures and second isolation structures having a preset height.

In some embodiments, S303 may include the following operations.

The first isolation layer having a preset height and the first gate dielectric layer having the preset height are removed by etching along the second direction, and the first gate insulating layer having the preset height and the second isolating layer having the preset height are exposed to form the first etched isolation layer and the second isolating structures having the preset height.

Figure 5K:
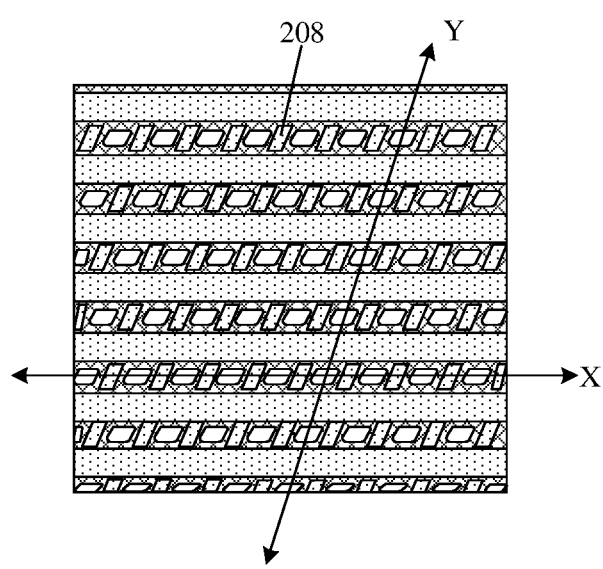
FIG. 5K is a structural scheme diagram showing a forming process of a semiconductor structure provided by the embodiments of the disclosure.
Figure 5L:
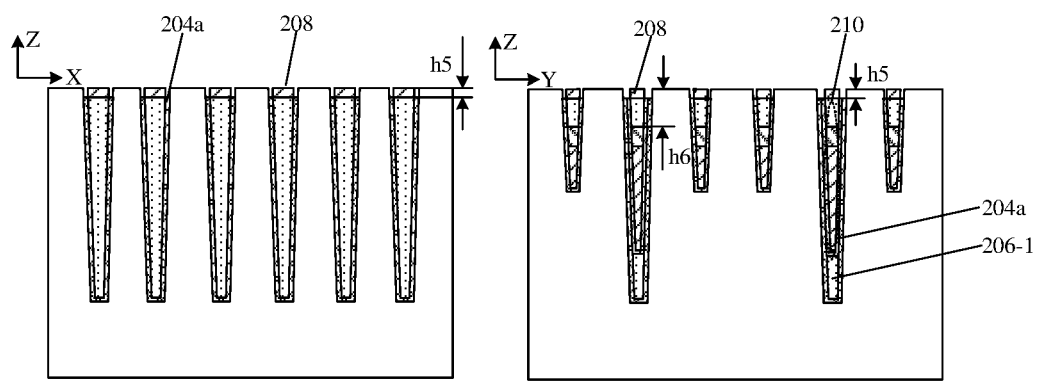
FIG. 5L is a structural scheme diagram showing a forming process of a semiconductor structure provided by the embodiments of the disclosure.

FIG. 5K is a top view of the formed second isolation structures provided by the embodiments of the disclosure. FIG. 5L is cross-sectional views along the X-axis direction and the Y-axis direction. As shown in FIGS. 5K and 5L, the first isolation layer, the first gate dielectric layer and the second gate dielectric layer, all of which having a preset height h5, are simultaneously removed by etching along the Z-axis direction, to expose the first gate insulating layer having the preset height h5 and the second gate insulating layer having the preset height h5, thereby forming second isolation structures 208 and first etched isolation layer 204a. The preset height h5 is smaller than an initial height h6 of the first gate insulating layer or the second gate insulating layer in the Z-axis direction.

In the embodiments of the disclosure, the preset height may be 5 nm to 20 nm.

It should be noted that the first isolation structures and the gate structures 210 are formed while forming the second isolation structures 208. In the embodiments of the disclosure, each first isolation structure includes an isolation trench and a first etched isolation layer 204a and a second etched isolation layer 206-1 located in the isolation trench.

In some embodiments, after forming the first isolation structures, the gate structures and the second isolation structures, the method for forming the semiconductor structure further includes the following operation. An epitaxial structure of an active area is formed between any two adjacent ones of the second isolation structures in the first direction.

Here, the epitaxial structure includes epitaxial silicon or doped epitaxial silicon.

In some embodiments, the operation that an epitaxial structure of an active area is formed between any two adjacent ones of the second isolation structures in the first direction may include the following operation.

The epitaxial structure is formed by adopting a preset reaction gas and taking the surface of the corresponding active area between any two adjacent ones of the second isolation structures in the first direction as a reaction base.

In the embodiments of the disclosure, the preset reaction gas includes hydrogen ($H_2$) and any one of silicon tetrachloride ($SiCl_4$), trichlorosilane ($SiHCl_3$), dichlorosilane ($SiH_2Cl_2$) and silane ($SiH_4$).

Figure 5M:
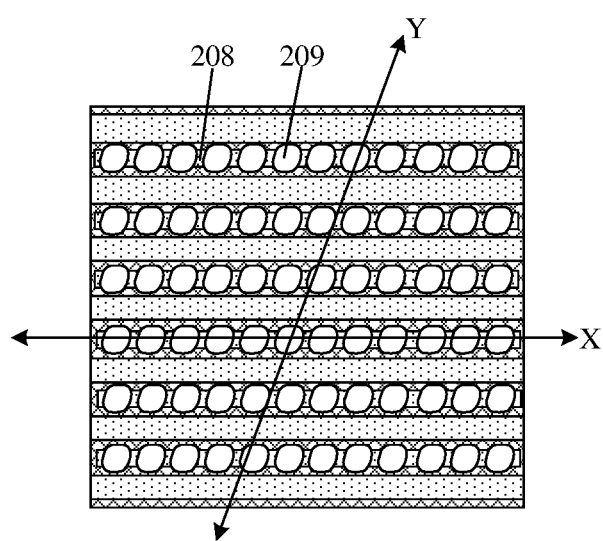
FIG. 5M is a structural scheme diagram showing a forming process of a semiconductor structure provided by the embodiments of the disclosure.
Figure 5N:
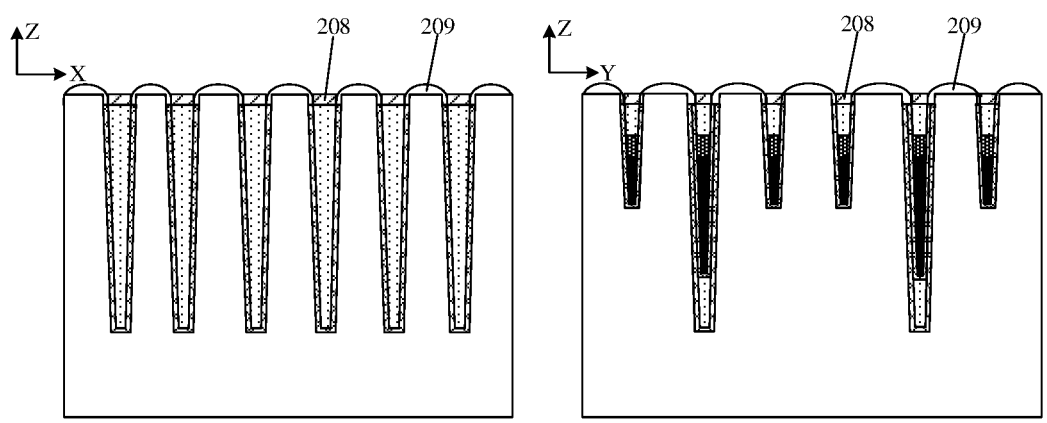
FIG. 5N is a structural scheme diagram showing a forming process of a semiconductor structure provided by the embodiments of the disclosure.

FIG. 5M is a top view of the formed epitaxial structures provided by the embodiments of the disclosure. FIG. 5N is cross-sectional views along the X-axis direction and Y-axis direction. As shown in FIGS. 5M and 5N, an epitaxial structure 209 is formed by a gas phase epitaxial growth process using a surface of the corresponding active area between any two adjacent ones of the second isolation structures 208 in the X-axis direction as a reaction base. In the embodiments of the disclosure, the sidewalls of each epitaxial structure 209 are in contact with the adjacent second isolation structures 208, and the top surface of the epitaxial structure 209 extends beyond the top surface of the second isolation structures 208.

In some embodiments, the active areas are doped with a specific ion with a first preset concentration. After forming the epitaxial structure, the method for forming the semiconductor structure further includes the following operation.

The epitaxial structures are doped with the ion at a second preset concentration. The first preset concentration is less than the second preset concentration.

In the embodiments of the disclosure, the ion used to dope the active areas may be an ion from Group VI element or Group III element.

It should be noted that in the embodiments of the disclosure, the type of the ion doped to the epitaxial structures is the same as the type of the ion doped to the active areas.

In the embodiments of the disclosure, the epitaxial structures are dope with a high-concentration ion. By doing so, contact resistance between the epitaxial structures and the active areas can be reduced, thereby improving the electrical properties of the formed semiconductor structure.

In some embodiments, after forming the epitaxial structures, the method for forming the semiconductor structure further includes the following operation.

A bit line structure is formed on the surface of an active area located between two adjacent ones of the gate structures in the active area.

Figure 5O:
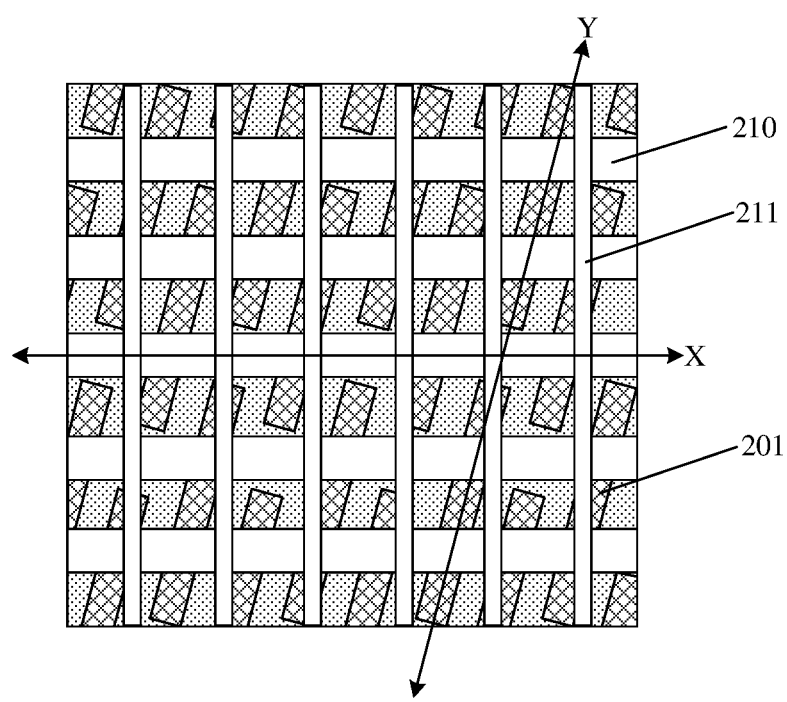
FIG. 5O is a structural scheme diagram showing a forming process of a semiconductor structure provided by the embodiments of the disclosure.
Figure 5P:
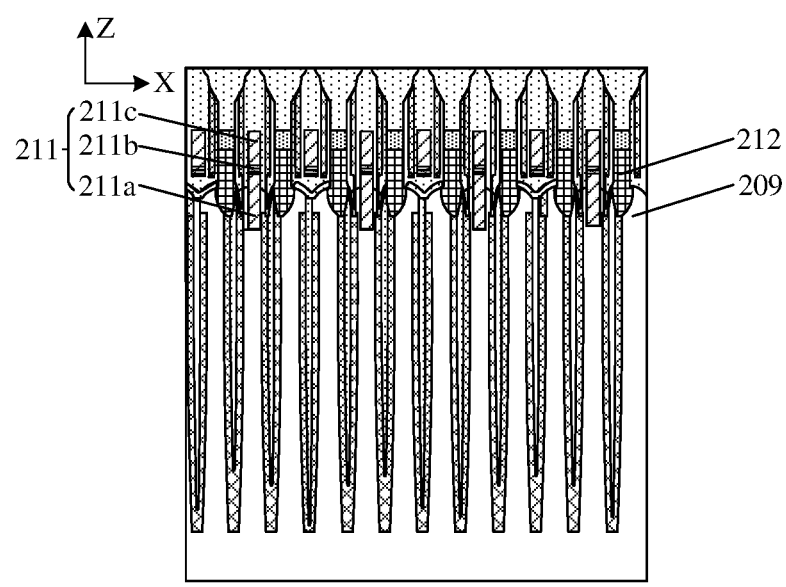
FIG. 5P is a structural scheme diagram showing a forming process of a semiconductor structure provided by the embodiments of the disclosure.

FIG. 5O is a top view of formed the bit line structures provided by the embodiments of the disclosure. FIG. 5P is a cross-sectional view in the Y-axis direction. As shown in FIGS. 5O and 5P, each bit line structure 211 is formed on a surface of an active area between two adjacent ones of the gate structures 210 in the active areas 201. A direction in which the bit line structure 211 extends is perpendicular to a direction in which the gate structure 210 extends. Each bit line structure 211 includes at least a bit line contact layer 211a, a bit line metal layer 211b and a bit line insulating layer 211c stacked in order from the bottom to the top along the Z axis direction.

Storage node contacts are formed on sidewalls of the bit line structures. The storage node contact is in contact with the top surface of the epitaxial structure.

Again, referring to FIG. 5P, the storage node contacts 212 are formed on the sidewalls of the bit line structures 211. Each of the storage node contacts 212 is in contact with a top surface of an epitaxial structure 209.

Figure 5Q:
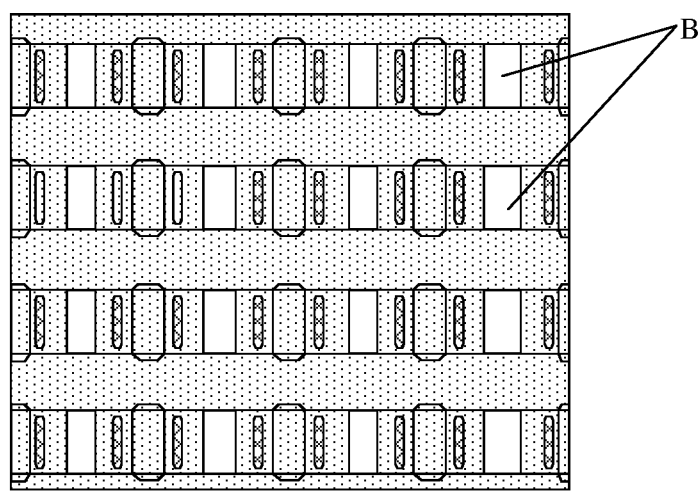
FIG. 5Q is a structural scheme diagram showing a forming process of a semiconductor structure provided by the embodiments of the disclosure.

FIG. 5Q is a top view of the semiconductor structure provided by embodiments of the disclosure. As shown in FIG. 5Q, it can be seen that the contact windows B for the storage node contacts and the active areas is large in the semiconductor structure provided by the embodiment of the disclosure. Therefore, the efficiency of the alignment between an active area and a storage node contacts can be improved, thereby reducing the contact resistance between the storage node contact and the active area, improving the reading and writing speed of the memory unit, and further improving the preparation yield of the semiconductor device.

The method for forming the semiconductor structure provided by the embodiments in the disclosure is similar to the semiconductor structure in the above-mentioned embodiments. For technical features not disclosed in detail by the embodiments of the disclosure, please refer to the above-mentioned embodiments for understanding, and they will not be repeated here.

The semiconductor structure formed by the method for forming the semiconductor structure provided by the embodiments of the disclosure includes the second isolation structures that can be used to isolate adjacent SNCs, so that the formed SNCs are not short-circuited, and the electrical properties of the prepared semiconductor structure are improved.

In the several embodiments provided by the disclosure, it should be understood that the disclosed apparatus and methods may be implemented in a non-target manner The embodiments of the device described above are only schematic. For example, the division of the unit is only a logical function division, and there may be another division mode in actual implementation, such as: multiple units or components can be combined, or integrated into another system, or some features can be ignored or not executed. In addition, the components shown or discussed are coupled with each other, or directly coupled.

The units described above as separate components may or may not be physically separated, and the units displayed as component s may or may not be physical units, that is, may be located in one place or may be distributed over multiple network units. According to the actual needs, some or all of the units can be selected to achieve the purpose of the embodiments.

The features disclosed in several method or device embodiments provided in this disclosure can be arbitrarily combined without conflict to obtain a new method or device embodiment.

The above are only some implementations of the embodiments of the disclosure, but the scope of protection of the embodiments of the disclosure is not limited thereto. Any technician familiar with the technical field who can easily think of changes or replacements within the technical scope disclosed by the embodiments of the disclosure should be covered within the scope of protection of the embodiments of the disclosure. Therefore, the protection scope of the disclosed embodiments should be based on the protection scope of the claims.

What is claimed is:

1. A method for forming a semiconductor structure, comprising:
providing a semiconductor substrate, wherein the semiconductor substrate comprises a plurality of formed active areas and first initial isolation structures arranged at intervals along a first direction;
forming initial gate structures in the first initial isolation structures; and
etching the initial first isolation structures and the initial gate structures to form first isolation structures, gate structures and second isolation structures having a preset height;
wherein the first initial isolation structures are formed by:
etching the semiconductor substrate to form a plurality of isolation trenches arranged at intervals along the first direction; and
forming a first isolation layer and a second isolation layer sequentially on inner walls of the isolation trenches to form the first initial isolation structures, wherein the second isolation layer fills the isolation trenches;
wherein the first initial isolation structures are formed by:
etching the semiconductor substrate to form a plurality of isolation trenches arranged at intervals along the first direction; and
forming a first isolation layer and a second isolation layer sequentially on inner walls of the isolation trenches to form the first initial isolation structures, wherein the second isolation layer fills the isolation trenches;
wherein the first isolation layer is also attached to surfaces of the active areas, and the first isolation layer is formed by:
depositing a sacrificial material on the inner walls of the isolation trenches and the surfaces of the active areas to form a sacrificial layer; and
oxidizing the sacrificial layer in situ to form the first isolation layer;
wherein the second isolation layer is formed by:
depositing a second isolation material on a surface of the first isolation layer to form a second initial isolation layer; and
processing the second initial isolation layer to form the second isolation layer;
wherein the processing of the second initial isolation layer to form the second isolation layer comprises:
planarizing or etching the second initial isolation layer until the first isolation layer on the surfaces of the active areas is exposed to form the second isolation layer;
wherein the forming initial gate structures in the first initial isolation structures comprises:
etching part of the second isolation layer in a second direction to form first gate trenches and a second etched isolation layer, wherein the second direction is a direction along a thickness of the semiconductor substrate, and the second direction is perpendicular to the first direction;
forming a first gate dielectric layer on inner walls of the first gate trenches;
forming a first gate metal layer at a bottom of the first gate trenches on which the first gate dielectric layer is formed; and forming a first gate insulating layer on a surface of the first gate metal layer;

wherein the initial gate structures are also formed in the active areas, wherein the initial gate structures in the active areas are formed by:

etching the first isolation layer and the active areas sequentially along the second direction to form second gate trenches;

forming a second gate dielectric layer on inner walls of the second gate trenches;

forming a second gate metal layer in the second gate trenches on which the second gate dielectric layer is formed; and forming a second gate insulating layer on a surface of the second gate metal layer, wherein a size of a second gate trench in the second direction is smaller than a size of a first gate trench in the second direction, and a size of the second gate metal layer in the second direction is smaller than a size of the first gate metal layer in the second direction; and wherein the second isolation structures are formed by:

etching and removing the first isolation layer with the preset height, the first gate dielectric layer with the preset height and the second gate dielectric layer with the preset height along the second direction, and exposing the first gate insulating layer with the preset height and the second gate insulating layer with the preset height, to form the second isolation structures and a first etched isolation layer, wherein the preset height is smaller than an initial height of the first gate insulating layer in the second direction, and the preset height ranges from 5 nm to 20 nm.

2. The method according to claim 1, wherein materials of the first isolation layer and the first gate dielectric layer are same, or the first isolation layer and the first gate dielectric layer have a same etching selection ratio.

3. A method for forming a semiconductor structure, comprising:

providing a semiconductor substrate, wherein the semiconductor substrate comprises a plurality of formed active areas and first initial isolation structures arranged at intervals along a first direction;

forming initial gate structures in the first initial isolation structures; and etching the initial first isolation structures and the initial gate structures to form first isolation structures, gate structures and second isolation structures having a preset height;

wherein after forming the first isolation structures, the gate structures and the second isolation structures, the method further comprises:

forming epitaxial structures on the active areas between two adjacent ones of the second isolation structures in the first direction;

wherein the forming epitaxial structures of the active areas between two adjacent ones of the second isolation structures in the first direction comprises:

forming the epitaxial structures by adopting a preset reaction gas and taking the surfaces of the active areas between two adjacent ones of the second isolation structures in the first direction as a reaction base; and wherein the active areas are doped with a particular type of an ion at a first preset concentration; after the forming the epitaxial structures, the method further comprises:

doping the epitaxial structures with the ion at a second preset concentration to form doped epitaxial structures, wherein the first preset concentration is less than the second preset concentration.

* * * * *